United States Patent [19]

Poli et al.

[11] Patent Number: 4,981,315
[45] Date of Patent: Jan. 1, 1991

[54] TIP FOR A VACUUM PIPETTE

[75] Inventors: Bernard Poli; Gérard Chincholle, both of Saint Etienne, France

[73] Assignee: Recif, S.A., France

[21] Appl. No.: 515,790

[22] Filed: Apr. 24, 1990

Related U.S. Application Data

[63] Continuation of Ser. No. 287,167, Dec. 21, 1988, abandoned.

[30] Foreign Application Priority Data

Dec. 22, 1987 [FR] France .................................. 87 18455

[51] Int. Cl.⁵ .............................................. B25S 15/06
[52] U.S. Cl. ..................................... 294/64.1; 29/743
[58] Field of Search .................. 29/743; 294/64.1, 65; 269/21

[56] References Cited

U.S. PATENT DOCUMENTS

| | | |
|---|---|---|
| 954,927 | 4/1910 | Burdick . |
| 1,302,028 | 4/1919 | Fuchs et al. . |
| 3,071,402 | 1/1963 | Lasto et al. . |
| 3,335,727 | 8/1967 | Spoto . |
| 3,843,183 | 10/1974 | Hutson . |
| 4,050,729 | 9/1977 | Hutson ............................. 294/64.1 |
| 4,212,300 | 7/1980 | Meals . |
| 4,496,180 | 1/1985 | Hillman ............................ 294/64.1 |
| 4,620,738 | 11/1986 | Schwartz ......................... 294/64.1 |
| 4,687,242 | 8/1987 | Van Rooy ........................ 294/64.1 |
| 4,736,508 | 4/1988 | Poli ................................... 294/64.1 |
| 4,767,142 | 8/1988 | Takahahi ......................... 294/64.1 |
| 4,773,687 | 9/1988 | Bush ................................. 294/64.1 |
| 4,875,279 | 10/1989 | Sakiadis ............................... 29/740 |
| 4,887,351 | 12/1989 | Porterfield et al. ............. 294/64.1 |
| 4,904,012 | 2/1990 | Nishiguchi et al. ............. 294/64.1 |
| 4,910,864 | 3/1990 | Elliott ............................... 294/64.1 |

FOREIGN PATENT DOCUMENTS

| | | |
|---|---|---|
| 8101666 | 6/1981 | European Pat. Off. . |
| 2628488 | 1/1978 | Fed. Rep. of Germany . |
| 2631502 | 1/1978 | Fed. Rep. of Germany . |
| 2591138 | 6/1987 | France . |
| 52-58480 | 5/1977 | Japan ................................ 294/64.1 |
| 52-58589 | 5/1977 | Japan . |
| 52-88090 | 7/1977 | Japan . |
| 53-39874 | 4/1978 | Japan . |
| 54-33678 | 3/1979 | Japan . |
| 248952 | 1/1970 | U.S.S.R. . |
| 2087348 | 5/1982 | United Kingdom ............... 29/743 |

OTHER PUBLICATIONS

IBM Technical Disclosure Bulletin, vol. 24, #6, Nov. 1981, Vacuum Wafer Pick-Up Tip.
IBM Tech Disc. Bul. vol. 16, No. 11, Apr. 1974 pp. 3651–3652.
IBM Tech Disc. Bul. vol. 20, No. 3, Aug. 1977 p. 1015.

Primary Examiner—Howard N. Goldberg
Assistant Examiner—I. Cuda
Attorney, Agent, or Firm—Townsend and Townsend

[57] ABSTRACT

A tip having a flattened part (1b) which has a suction gripping (1b2) at the end, which is raised very slightly to reduce the contact surface of the wafer and prevent it from touching the rest of the flattened part.

7 Claims, 1 Drawing Sheet

U.S. Patent
Jan. 1, 1991
4,981,315
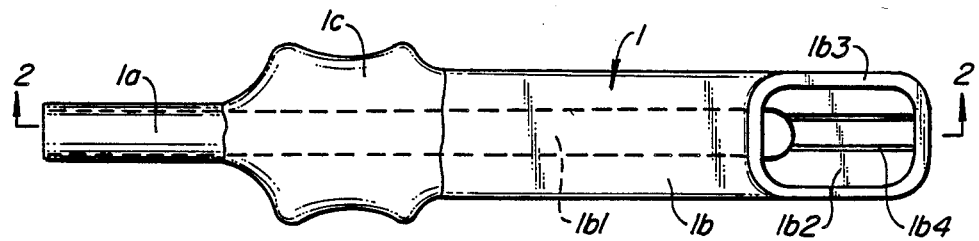
FIG._1.
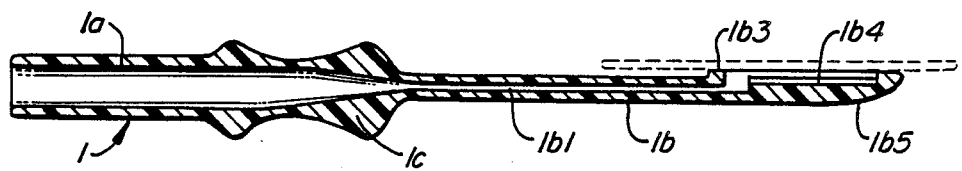
FIG._2.
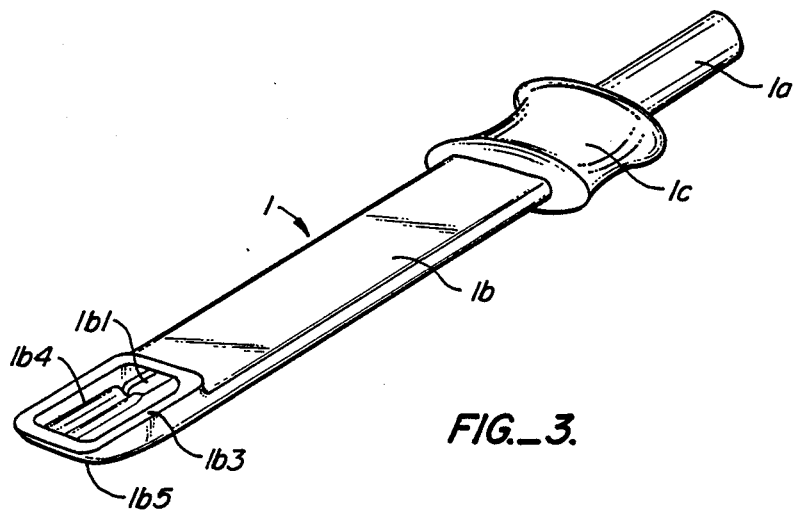
FIG._3.

TIP FOR A VACUUM PIPETTE

This is a continuation of application Ser. No. 07/287,167, filed Dec. 21, 1988, now abandoned.

FIELD OF THE INVENTION

The invention relates to industrial microelectronics.

BACKGROUND OF THE INVENTION

It is known to equip vacuum pipettes with a tip designed for gripping certain components of the silicon wafer variety by means of suction.

SUMMARY OF THE INVENTION

One of the problems which the invention was intended to solve was to reduce contamination of the wafers to a minimum. To this end, the flattened part of the tip has, at its free end a suction gripping zone which is raised very slightly to reduce the contact surface with the wafer and prevent it from touching the rest of the flattened part.

In an advantageous way, a peripheral, concentric boss is formed in the axial direction, defining the gripping zone, from which emerges in familiar fashion, an internal duct communicating with the rear connecting part.

Another characteristic is that the gripping zone is ribbed to prevent the gripped wafer from being deformed.

Another problem which is solved is facilitating manual gripping of the tip with the body of the pipette to which it is attached.

For this purpose, a gripping part, shaped and dimensioned according to ergonomic criteria, is located between the rear connecting part and the flattened part.

The invention also solves the problem of reducing scratching during handling.

For this purpose, the tip is made by injecting carbon fiber filled poly-ether-ether-ketone.

Other characteristics will emerge from the rest of the description.

BRIEF DESCRIPTION OF THE DRAWINGS

The invention is explained in more detail below with the aid of the attached drawings, in which:

FIG. 1 is a plan view of the tip;

FIG. 2 is a view along a longitudinal section, as seen along line 2—2 in FIG. 1; and FIG. 3 is a perspective view of the tip.

DETAILED DESCRIPTION OF THE PREFERRED EMBODIMENT

There now follows a non-limitative description with reference to the figures in the drawings.

In a familiar fashion, tip, designated in its entirety by (1), comprises a rear connecting part (1a) and a front part (1b) suitable for gripping a wafer. The rear part (1a) is generally formed by a hollow tube intended to be connected to the end of the pipette body. This tube (1a) communicates by means of an internal duct (1b1) with the front part (1b) which is flattened. The duct (1b1) ends in an axial oblong aperture (1b2), thus forming a suction gripping zone.

According to the invention, the gripping zone (1b2) is raised very slightly above the plane defined by the flattened part (1b), thus reducing the contact surface of the wafer (P). The wafer (P) is not in contact with the whole of the flattened part, but is only in contact at the level of the gripping zone (shown by the chain-dotted line in FIG. 2).

In the example shown, a boss (1b3) is formed peripherally and concentrically with reference to the axial aperture (1b2) defining the suction gripping zone.

To prevent the gripped wafer from being deformed, ribs (1b4) are formed in the gripping zone, particularly at the level of the oblong aperture (1b2). The front end of the gripping zone is connected to the underside of the flattened part (1b) by a wide radius of curvature (1b5).

The tip (1) is made by injecting carbon fiber filled poly-ether-ether-ketone. This reduces the risk of scratching during handling and allows the product to work at temperatures which can reach 310° C.

To facilitate and improve the manual gripping of the tip together with the pipette body (not shown), provision is also made for forming a gripping part (1c), shaped and dimensioned according to ergonomic criteria, at the level of the connection of the rear part (1a) and the flattened front part (1b).

The advantages are evident from the description. Although the invention has been described with reference to a specific exemplary embodiment, various modifications and changes may be made without departing from the broader spirit and scope of the invention as set forth in the appended claims. Accordingly, the specification and figures are to be regarded as illustrative rather than restrictive.

We claim:

1. A tip for a vacuum tool for manipulating semiconductor wafers, comprising:

connecting means adapted for coupling the tip to said tool;

a wafer gripping area having an opening for applying vacuum to a wafer;

internal duct means coupled to said opening and to said connecting means for communicating vacuum to said wafer gripping area;

raised boss means formed peripherally about said wafer gripping area for making contact with said wafer; and support means located within said wafer gripping area for preventing deformation of said wafer when in contact with said raised boss means.

2. The tip of claim 1 wherein the tip is formed from poly-ether-ether-ketone with imbedded carbon fibers.

3. The tip of claim 1 wherein said support means comprises elongated rib means.

4. The tip of claim 3 wherein said rib means comprises a pair of spaced parallel ribs positioned on opposite sides of said opening.

5. The tip of claim 1 wherein the surface of the raised boss means which contacts the wafer and the surface of the support means which contacts the wafer are coplanar.

6. The tip of claim 1 including gripping means formed intermediate to said connecting means and said wafer gripping area, said gripping means being adapted to facilitate physical manipulation of the tip without physical contact with said connecting means or said wafer gripping area.

7. The tip of claim 1 wherein said raised boss means is concentric with said wafer gripping area.

* * * * *